(12) United States Patent
Watanabe

(10) Patent No.: US 6,511,858 B2
(45) Date of Patent: Jan. 28, 2003

(54) METHOD FOR FABRICATING SEMICONDUCTOR DEVICE

(75) Inventor: Takayuki Watanabe, Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 09/946,686

(22) Filed: Sep. 6, 2001

(65) Prior Publication Data

US 2002/0127759 A1 Sep. 12, 2002

(30) Foreign Application Priority Data

Sep. 27, 2000 (JP) ........................................ 2000-293877

(51) Int. Cl.⁷ .............................................. H01L 21/00
(52) U.S. Cl. ........................................ 438/47; 438/590
(58) Field of Search .............................. 438/47, 46, 590

(56) References Cited

U.S. PATENT DOCUMENTS 5,822,349 A * 10/1998 Takaoka et al. ............... 372/46

FOREIGN PATENT DOCUMENTS

| EP | 1014430 A1 | * | 6/2000 | ........... H01L/21/20 |
| JP | 61032585 A | * | 2/1986 | ............ H01S/3/18 |
| JP | 363152180 A | * | 6/1988 | ........... H01L/33/00 |
| JP | 401315184 A | * | 12/1989 | ............ H01S/3/18 |
| JP | 06283816 A | | 10/1994 | |
| JP | 8-250808 | * | 8/1996 | ............ H01S/3/18 |
| JP | 410178236 A | * | 6/1998 | ............ H01S/3/18 |

* cited by examiner

Primary Examiner—Olik Chaudhuri
Assistant Examiner—David S Blum
(74) Attorney, Agent, or Firm—Armstrong, Westerman & Hattori, LLP

(57) ABSTRACT

An n type InP buried layer 22 with Se or S added in an above $5 \times 10^{18}$ cm$^{-3}$ concentration is formed on an active layer mesa stripe 18 having a surface with an SiO$_2$ film 16 formed on at a peripheral part of the mesa stripe 18 other than the surface with the SiO$_2$ film 16 formed on. Accordingly, the buried layer can be grown without the over growth.

20 Claims, 13 Drawing Sheets

METHOD FOR FABRICATING SEMICONDUCTOR DEVICE

BACKGROUND OF THE INVENTION

The present invention relates to a method for fabricating semiconductor device, more specifically a method for fabricating a semiconductor device including an optical integrated circuit, etc. for use in optical communication, photocoupling, etc.

In an optical semiconductor device of an InP-based material, horizontal light confinement depends on refractive index differences between the InGaAsP core and the InP buried layer, which guide light. As a structure for realizing such light confinement, the buried hetero (BH) structure used in semiconductor lasers is known.

A method for fabricating a semiconductor laser of the BH structure will be explained with reference to FIGS. 10A–10E. FIGS. 10A–10E are sectional views of the semiconductor laser in the steps of the method for fabricating the semiconductor laser.

As shown in FIG. 10A, an InGaAsP/InGaAsP multi-quantum well layer 102, a p type InP clad layer 104 are formed sequentially on an n type InP substrate 100.

Then, as shown in FIG. 10B, an $SiO_2$ film 106 as an etching protection film is formed on the p type InP clad layer 104, and an active layer mesa stripe 108 are formed by dry etching. The active layer mesa stripe 108 has <011> direction.

Subsequently, as shown in FIG. 10C, with the $SiO_2$ film 106 as a selective growth mask, a p type InP buried layer 110 and an n type InP buried layer 112 are sequentially crystal-grown on the InP substrate 100 around the active layer mesa stripe 108 by metal organic vapor phase epitaxy (MOVPE). In the crystal growth by the MOVPE, a chlorine-based gas, such as $CH_3Cl$ or others, is added so that, as shown in FIG. 10C, the crystal growth of the n type InP buried layer 112 stops at a (111) B plane as the growth stop face. Thus, the n type InP buried layer 112 can be formed, not growing over the $SiO_2$ film 106.

Following the formation of the n type InP buried layer 112, the $SiO_2$ film 106 is removed by etching using HF, and a p type InP clad layer 114 and a p type InGaAs contact layer 116 are sequentially formed on the entire surface.

Finally, an n type electrode 118 is formed on the underside of the n type InP substrate 100, and a p type electrode 120 is formed on a p type InGaAs contact layer 116. Thus, the fabrication of the semiconductor laser of the BH structure is completed.

Recently in the optical communication technique, for multi-wavelength communication and high-speed light modulation, optical integrated circuits having photodividers, photocouplers, photomodulators, photoswitches, etc. integrated have become key devices. Such optical integrated circuits are fabricated by the same method as the semiconductor laser of the BH structure described above.

However, in fabricating the optical integrated circuit of the BH structure, the step of forming the buried layer after forming the active layer mesa stripe has problems although the step has no problem in fabricating the semiconductor laser.

The resonator of the above-described semiconductor laser has <011> direction. As shown in FIG. 10C, the crystal growth of the n type InP buried layer 112 stops at the (111) B plane as the growth stop plane, so that the n type InP buried layer 112 can be formed, not growing over the selective growth mask.

On the other hand, the wave guide of the optical integrated circuit has the function of coupling various devices and, for the function, has parts of different directions, a branch part and a terminal part. FIG. 11 is a view of a structure of the active layer mesa stripe of the optical integrated circuit with $SiO_2$ film as the selective growth mask. As shown in FIG. 11, a branch part 122 and a terminal part 124 are formed in the active layer mesa stripe 121 of the optical integrated circuit, and a part 126 of a direction other than <011> direction is formed in the active layer mesa stripe. In order to form the buried layer in such active layer mesa stripe 121 the $SiO_2$ film 128 is formed as a selective growth mask.

In a case that the selective growth mask is formed at the branch part 122 or the terminal part 124, or a part 126 of a direction other than <011> direction, no specific growth stop plane is present in forming the buried layer. Accordingly, the buried layer grows over the selective growth mask. FIGS. 12A, 12B and 12C respectively show growth of the buried layer at the branch part 122, the terminal part 124 and the part 126 of a direction other than <011> direction. As shown in FIGS. 12A–12C, at the branch part 122 and the others the buried layer 120 is formed, growing over the $SiO_2$ film 128, which is the selective growth mask formed on the active layer mesa stripe 121. Such over growth of the buried layer 130 cannot be prevented even by addition of chlorine gas at the time of the crystal growth.

In the optical integrated circuit, stacking dislocations unpreferably occur in a part where the above-described over growth has taken place. Furthermore, the overhang of the buried layer formed by the over growth form voids therebelow in the step of removing the selective growth mask to form a clad layer and a contact layer. FIG. 13 shows one example of the sectional configuration of the optical integrated circuit having a void formed by the over growth of the buried layer.

As shown in FIG. 13, a p type InP buried layer 134 and an n type InP buried layer 136 are formed in layers on both sides of the active layer mesa stripe 121 formed on an n type InP substrate 132. Furthermore, on the upper surface of these layers a p type InP clad layer 138, a p type InGaAs contact layer 140 are sequentially formed. The n type InP buried layer 136 has overhanging parts 142 growing over the active layer mesa stripe 121. Below the overhanging parts 142 the p type InP clad layer 138 is not formed, forming voids 144.

The stacking dislocation and void due to the above-described over growth of the buried layer cause deflection of a refractive index which hinders waveguide of light, and furthermore cause electric characteristic deterioration in the operation of the device.

SUMMARY OF THE INVENTION

An object of the present invention is to provide a method for fabricating semiconductor device which can grow a buried layer on a projected structure, such as a mesa stripe, without over growth.

The above-described object is achieved by a method for fabricating semiconductor device comprising: the step of forming a buried layer of III–V group semiconductor with Se or S added in an above $5 \times 10^{18}$ $cm^{-3}$ concentration against a projected structure including a surface with a mask formed on, at a peripheral part of the mesa structure without the mask formed on.

In the above-described method for fabricating semiconductor device it is possible that the III–V group semiconductor is InP.

In the above-described method for fabricating semiconductor device it is possible that the projected structure is a mesa stripe having a branching part.

In the above-described method for fabricating semiconductor device it is possible that the projected structure is a mesa stripe having a terminal part.

In the above-described method for fabricating semiconductor device it is possible that the projected structure is a mesa stripe having a <011> direction part and a part of a direction other than <011> direction.

In the above-described method for fabricating semiconductor device it is possible that a gas containing chlorine is introduced when the buried layer is formed.

In the above-described method for fabricating semiconductor device it is possible that the mask is a film of silicon oxide and/or silicon nitride.

BRIEF DESCRIPTION OF THE DRAWINGS

FIG. 11 is a diagrammatic view of the active layer mesa stripe of the optical integrated circuit, which has the selective growth mask formed on.

DETAILED DESCRIPTION OF THE INVENTION

A First Embodiment

Figure 2:
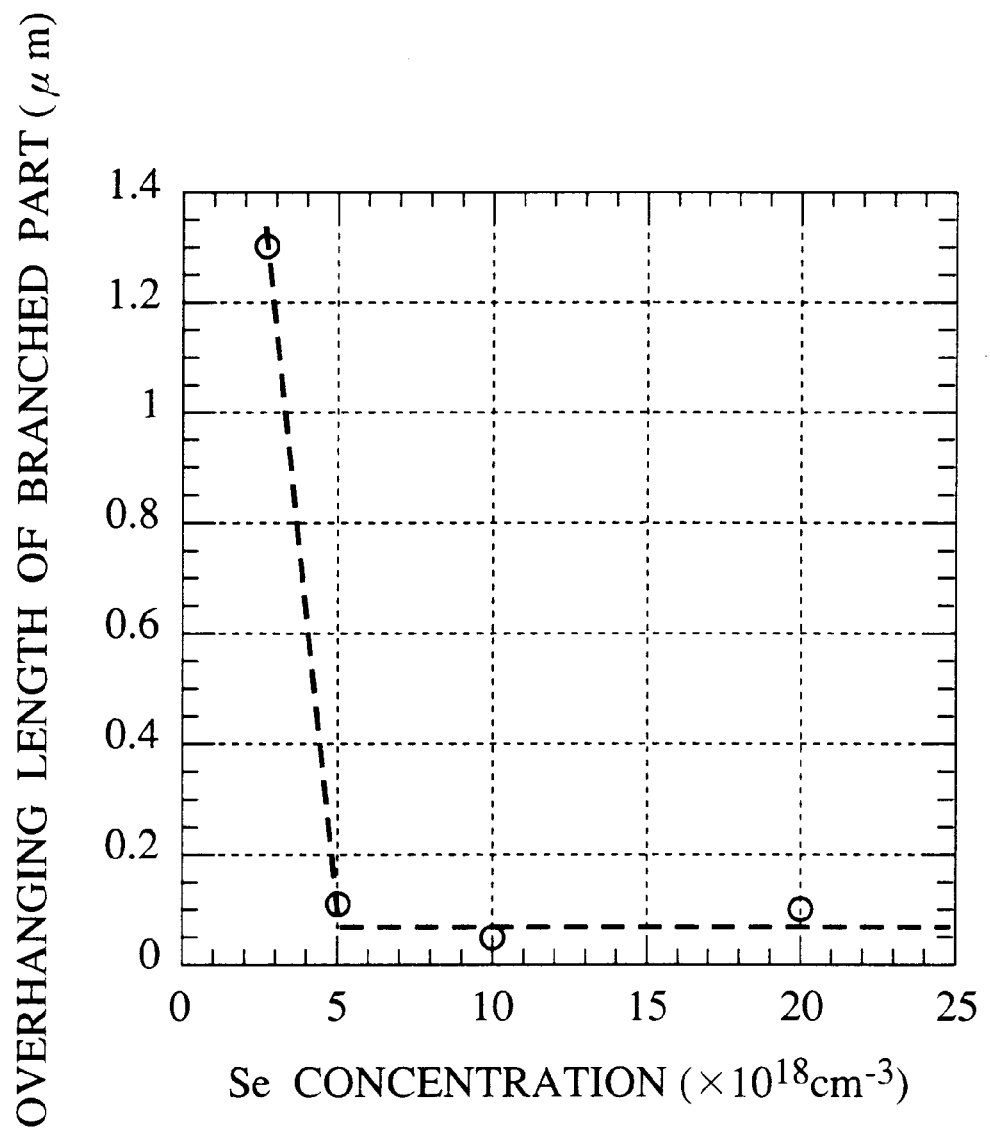
FIG. 2 is a graph of relationships between overhanging lengths of a branched part, and Se concentrations.
Figure 3:
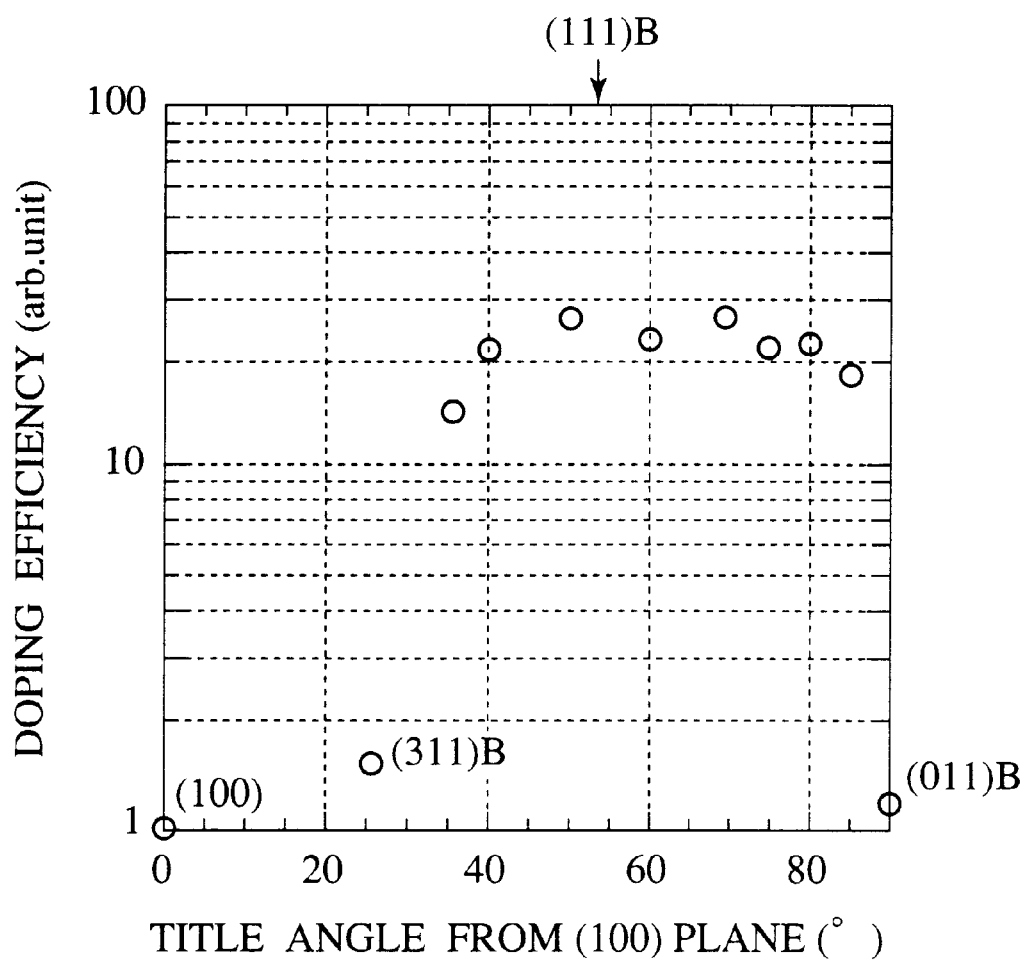
FIG. 3 is a graph of growth substrate orientation dependence of Se doping efficiency.
Figure 4:
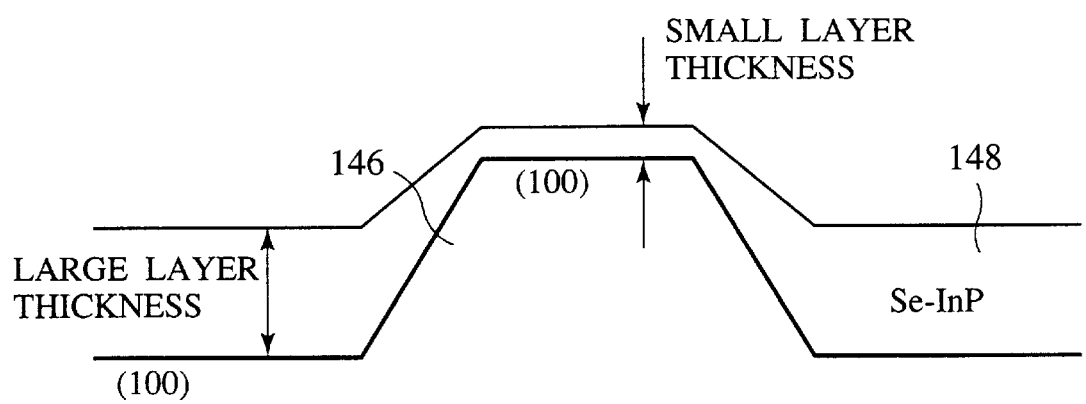
FIG. 4 is diagrammatic view of the conventional art for suppressing, by adding Se, growth of a semiconductor layer on a specific surface.

The method for fabricating semiconductor device according to a first embodiment of the present invention, for fabricating an optical integrated circuit will be explained with reference to FIGS. 1A–1E, 2, 3, and 4. FIG. 1A–1E are sectional views of the optical integrated circuit of the present embodiment in the steps of the method for fabricating semiconductor device according to the present embodiment. FIG. 2 is a graph of relationships between overhanging lengths of a branch part and Se concentrations. FIG. 3 is a graph of substrate dependence of Se doping efficiency. FIG. 4 is a diagrammatic view of prior art for Se addition suppressing growth of a semiconductor layer onto a specific plane.

The method for fabricating semiconductor device according to the present embodiment, for fabricating the optical integrated circuit forms the BH structure in the mesa stripe of a direction other than <011> direction.

Figure 1A:
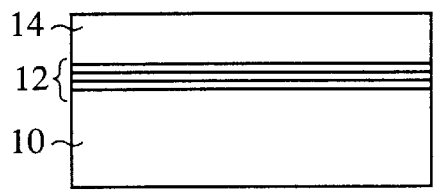
FIGS. 1A–1E are sectional views of an optical integrated circuit of a first embodiment of the present invention in the steps of the method for fabricating semiconductor device according to the first embodiment of the present invention, which show the method.

First, as shown in FIG. 1A, an InGaAsP/InGaAsP multi-quantum well layer 12 and a p type InP clad layer 14 are formed sequentially on an n type InP substrate 10.

Figure 1B:
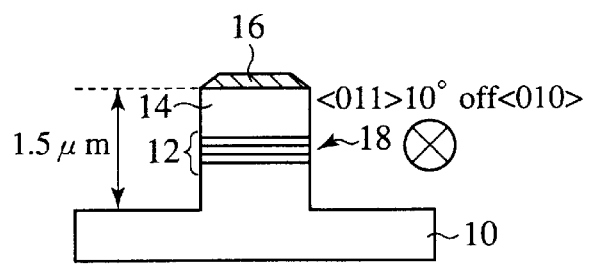

Next, as shown in FIG. 1B, an $SiO_2$ film 16 as an etching protection film is formed on the p type InP clad layer 14, and a about 1.5 $\mu$m-height active layer mesa stripe 18 having, e.g., <011> 10° off <010> direction, i.e., a direction tilted by 10°<010> direction off <011> direction is formed by dry etching.

Figure 1C:
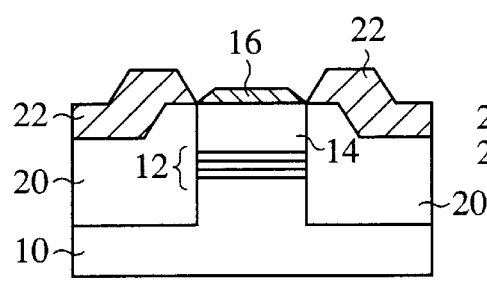

Subsequently, as shown in FIG. 1C, an about 1 $\mu$m-layer thickness p type InP buried layer 20 is crystal-grown on the InP substrate 10 on both sides of the active layer mesa stripe 18 by MOVPE with the $SiO_2$ film 16 as a selective growth mask. TMI (TriMethyl Indium) and $PH_3$ are used respectively as a III group element material and a V group element material. As a dopant gas DEZn (DiEthylzinc) is used to add Zn to the p type InP buried layer 20, and a p dopant concentration becomes about $1\times10^{18}$ cm$^{-3}$. A temperature and a pressure for the growth is about 630° C. and about 0.1 atmospheric pressure.

Following the formation of the p type InP buried layer 20, an about 0.7 $\mu$m thickness buried layer 22 is grown on the p type InP buried layer 20 by MOVPE (FIG. 1C). As a dopant gas, $H_2Se$ is used to add Se to the InP buried layer 22, and an n dopant concentration becomes about $5\times10^{18}$ cm$^{-3}$.

The effect of adding Se as an n type dopant in growing the n type InP buried layer 22 will be explained with reference to FIGS. 2 and 3.

FIG. 2 is a graph of Se concentration dependence of overhanging lengths of the n type InP buried layer over the selective growth mask at a branch part of the mesa stripe of a 1.5 $\mu$m-height. As apparent in FIG. 2, the over growth is substantially perfectly stopped at an added Se concentration of above $5\times10^{18}$ cm$^{-3}$. This phenomenon is explained as follows.

Se, which is a VI group element, is taken in at P lattice points to be a donor when the n type InP grows. The Se has doping efficient (an n type donor concentration/a dopant dose) which varies depending on substrate orientations. FIG. 3 is a graph of variations of the Se doping efficient depending on substrate orientations. As apparent in FIG. 3, in comparison with the doping efficient in the planes from (100) plane to (211)B plane and in (011)B plane, the doping efficient in the other planes is increased by above 1 figure.

It is known that grown planes, such as (111)B plane, etc. in the orientation where the Se doping efficient is higher are dominant at the end of the selective growth mask. Accordingly, when Se is added in a $5\times10^{18}$ cm$^{-3}$cm concentration in (100) plane, an Se concentration in a plane at the end of the selective growth mask is as high as $5\times10^{19}$ cm$^{-3}$cm, and the Se occupies the lattice points, whereby the InP crystal growth will be stopped. Furthermore, the raw material gas is not consumed on the selective growth mask, and the raw material will be diffused from the selective growth mask to the epitaxial layer. As a result, an Se concentration at the end of the selective growth mask will be increased more than estimated based on the substrate orientation dependence of the Se concentration.

The technique of adding Se in a concentration of above 5×10$^{18}$ cm$^{-3}$cm to the InP buried layer to thereby suppress the growth onto a specific plane is disclosed in Japanese Patent Application Laid-Open Publication No. 283816/1994. In this technique, as shown in FIG. 4, a buried structure is formed on a <011> mesa stripe 146 without the selective growth mask. At this time, the buried layer 148 is formed with Se added so as to use the fact that a growth rate on a (100) mesa top surface is lower than that at a (100) mesa side surface to thereby suppress the growth of the buried layer 148 on the (100) mesa top surface.

In contrast; to this, in the present invention suppresses over growth of the mesa stripe with the selective growth mask formed on, and is applicable to the active layer mesa stripe of directions other than <011>. Furthermore, the present invention is based on the principle that a growth rate becomes lower in an orientation where an Se doping efficiency increases. Thus, the invention disclosed in Japanese Patent Application Laid-Open Publication No. 283816/1994 is apparently different form the present invention.

As described above, the method for fabricating semiconductor device according to the present embodiment, for fabricating the optical integrated circuit is characterized in that Se is added as an n type dopant in forming the n type InP buried layer on the mesa stripe with the selective growth mask formed on. The method for fabricating semiconductor device according to the present embodiment, for fabricating the optical integrated circuit can suppress over growth of the n type InP buried layer on the selective growth mask.

Figure 1D:
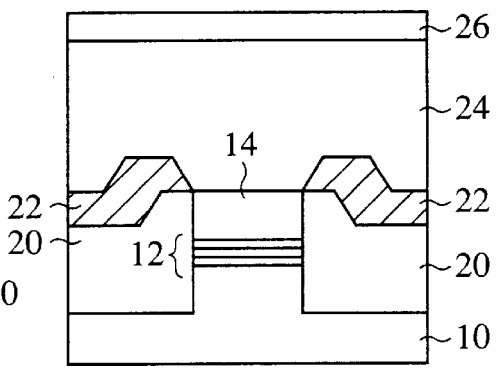

As described above, the SiO$_2$ film 16 is removed by etching using HF after the n type InP buried layer 22 is formed without the over growth. Subsequently, as shown in FIG. 1D, a p type InP clad layer 24 and a p type InGaAs contact layer 26 are sequentially formed.

Figure 1E:
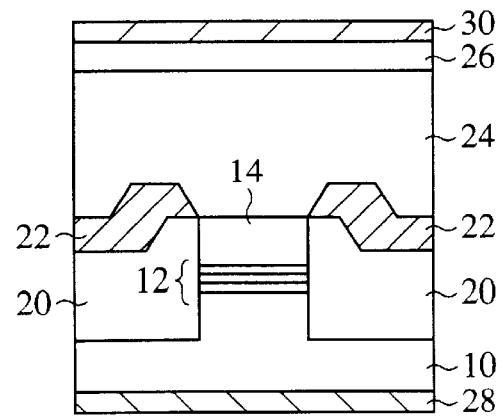

Finally, as shown in FIG. 1E, an n type electrode 28 is formed on the underside of the n type InP substrate 10, and a p type electrode 30 is formed on the p type InGaAs contact layer 26.Thus, the fabrication of the optical integrated circuit is completed.

As described above, according to the present embodiment, Se is added as an n type dopant in forming the n type InP buried layer, whereby the n type InP buried layer can be grown without the over growth on the selective growth mask.

A Second Embodiment

The method for fabricating semiconductor device according to a second embodiment of the present invention, for fabricating an optical integrated circuit will be explained with reference to FIGS. 5A–5E and 6A–6C. FIGS. 5A–5E are sectional views of the optical semiconductor device of the present embodiment in the steps of the method for fabricating semiconductor device according to the present embodiment, which show the method. FIGS. 6A–6C are perspective views of the optical integrated circuit of the present embodiment, which show the method for fabricating semiconductor device for fabricating the optical integrated circuit.

In the semiconductor device fabrication method according to the present embodiment, for fabricating the optical integrated circuit, the BH structure is formed in a mesa stripe having a terminal part.

Figure 5A:
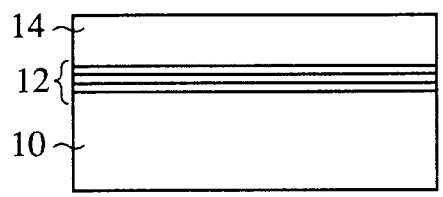
FIGS. 5A–5E are sectional views of an optical integrated circuit of a second embodiment of the present invention in the steps of the method for fabricating semiconductor device according to the second embodiment, which show the method.
Figure 6A:
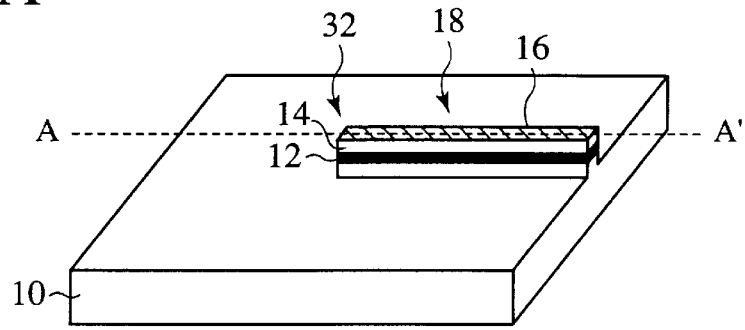
FIGS. 6A–6C are perspective views of the optical integrated circuit of the second embodiment of the present invention in the steps of the method for fabricating semiconductor device according to the second embodiment, which show the method.
Figure 6B:
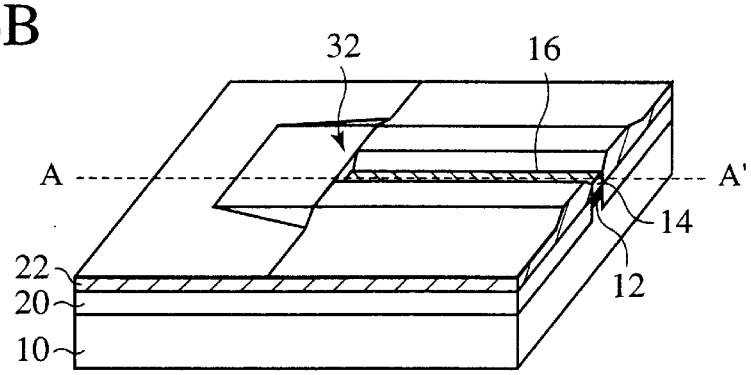
Figure 6C:
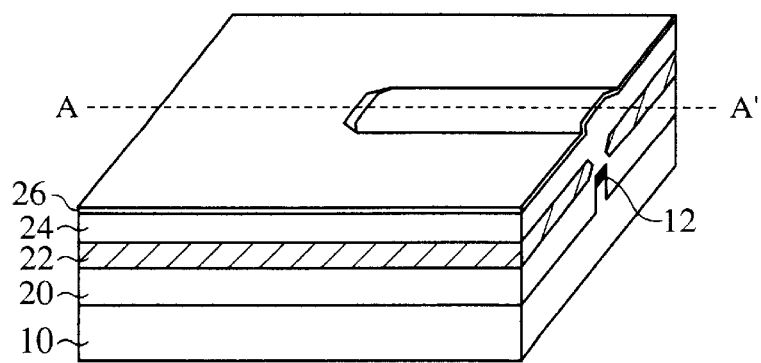

First, as shown in FIG. 5A, an InGaAsP/InGaAsP multi-quantum well layer 12 and a p type InP clad layer 14 are sequentially formed on an n type InP substrate 10.

Figure 5B:
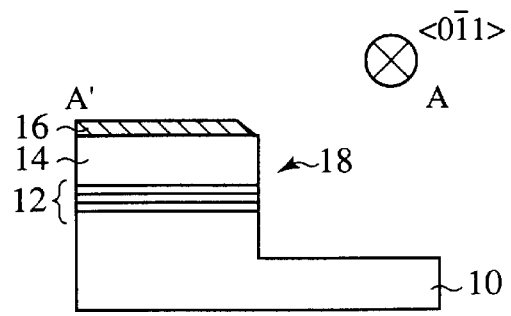

Next, as shown in FIGS. 5B and 6A, an SiO$_2$ film 16 is formed as an etching protection film on the p type InP clad layer 14 to form an about 1.5 μm-height <011> active layer mesa stripe 18 by dry etching. The active layer mesa stripe 18 has a terminal part 32. FIG. 5B is a sectional view along the line A–A' in FIG. 6A.

Figure 5C:
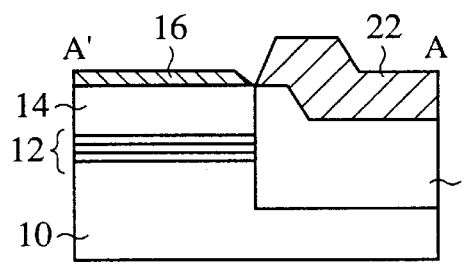

Next, as shown in FIGS. 5C and 6B, with the SiO$_2$ film 16 as a selective growth mask, an about 1 μm-thickness p type InP buried layer 20 is grown by MOVPE on the InP substrate 10 on both sides of the active layer mesa stripe 18. FIG. 5C is a sectional view along the line A–A' in FIG. 6C. TMI and. PH$_3$ are used respectively as a III group element material and a V group element material. DEZn is used as a dopant gas to add Zn to the p type InP buried layer, and a p doping concentration is about 1×10$^{18}$ cm$^{-3}$. A temperature and a pressure for the growth is respectively about 630° C. and about 0.1 atmospheric pressure.

Following the formation of the p type InP buried layer 20, an about 0.7 μm thickness n type InP buried layer 22 is grown by MOVPE on the p type InP buried layer 20 (FIGS. 5C and 6b). At this time, H$_2$Se is used as a dopant gas to add Se to the n type InP buried layer 22, and an n doping concentration is about 1×10$^{18}$ cm$^{-3}$.

As in the first embodiment, Se is added in growing the n type InP buried layer 22, whereby the over growth of the n type InP buried layer 22 does not take place at a terminal part 32.

Figure 5D:
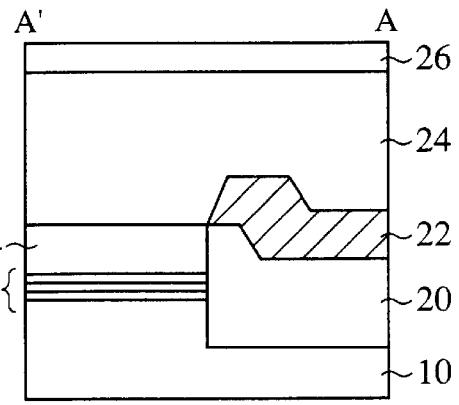

Then, the SiO$_2$ film 16 is removed by etching using HF, and as shown in FIGS. 5D and 6C, a p type InP clad layer 24 and a p type InGaAs contact layer 26 are sequentially formed on the entire surface. FIG. 5D is a sectional view along the line A–A' in FIG. 6C.

Figure 5E:
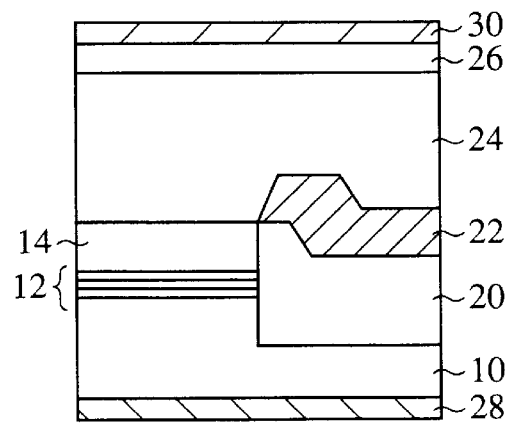

Finally, as shown in FIG. 5E, an n type electrode 28 is formed on the underside of the n type InP substrate 10, and a p type electrode 30 is formed on the p type InGaAs contact layer 26. Thus, the fabrication of the optical integrated circuit is completed.

As described above, according to the present embodiment, Se is added as an n type dopant in forming the n type InP buried layer, whereby the n type InP buried layer can be grown without the over growth on the selective growth mask.

A Third Embodiment

The method for fabricating semiconductor device according to a third embodiment of the present invention for fabricating an optical integrated circuit will be explained with reference to FIGS. 7A–7E and 8A–8C. FIGS. 7A–7E are sectional views of the optical integrated circuit of the present embodiment in the steps of the method for fabricating semiconductor device according to the present embodiment, which show the method. FIGS. 8A–8C are perspective views of the method for fabricating semiconductor device for fabricating the optical integrated circuit.

In the method for fabricating semiconductor device according to the present embodiment for fabricating the optical integrated circuit, the BH structure is formed in a mesa stripe having a branching part.

Figure 7A:
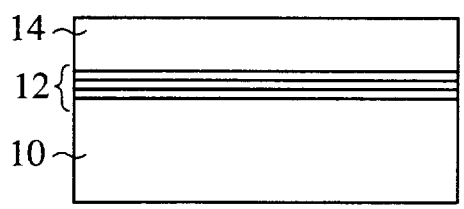
FIGS. 7A–7E are sectional views of an optical integrated circuit of a third embodiment of the present invention in the steps of the method for fabricating semiconductor device according to the third embodiment, which show the method.
Figure 8A:
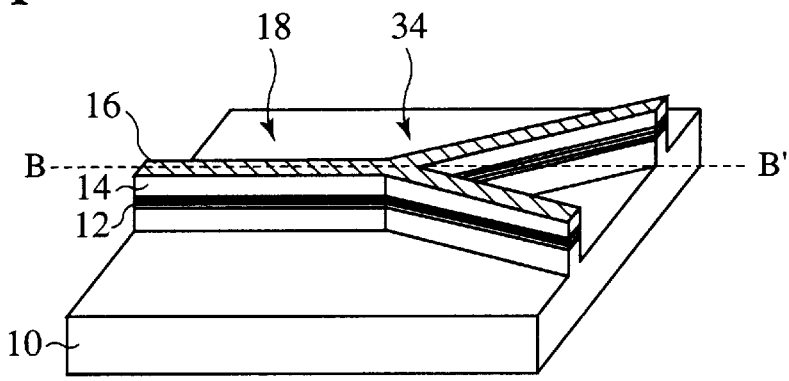
FIGS. 8A–8C are perspective views of the optical integrated circuit of the third embodiment of the present invention in the steps of the method for fabricating semiconductor device according to the third embodiment, which show the method.
Figure 8B:
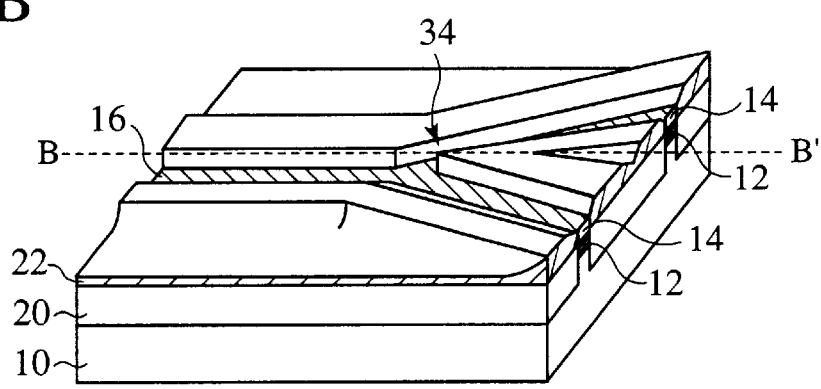
Figure 8C:
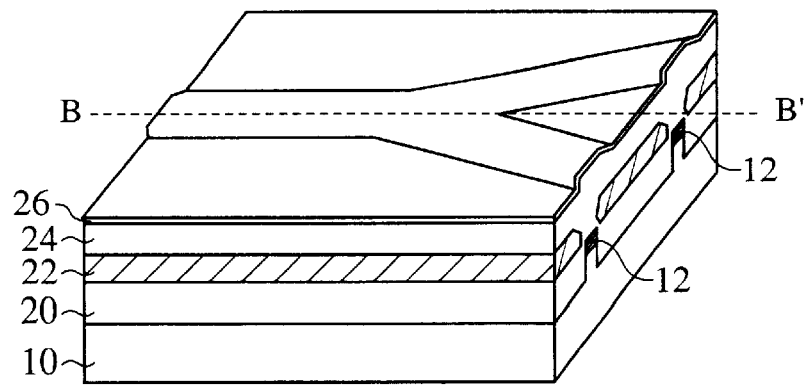

As shown in FIG. 7A, an InGaAsP/InGaAsP multi-quantum well layer 12 and a p type InP clad layer 14 are sequentially formed on an n type InP substrate 10.

Figure 7B:
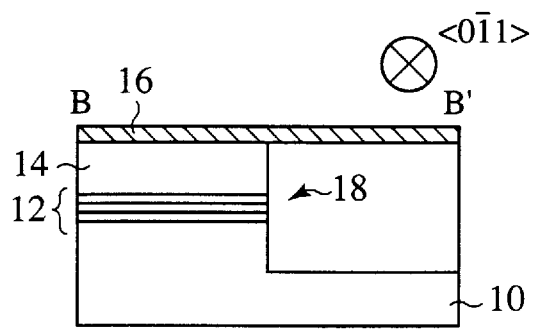

Then, as shown in FIGS. 7B and 8A, an $SiO_2$ film 16 is formed as an etching protection film on a p type InP clad layer 14, and an about 1.5 μm active layer mesa stripe 18 is formed by dry etching. The active layer mesa stripe 18 has a branching part 34. FIG. 7B is a sectional view along the line B–B' in FIG. 8A.

Figure 7C:
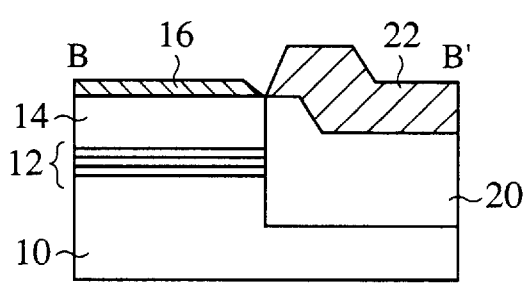

Subsequently, as shown in FIGS. 7C and 8B, with the $SiO_2$ film 16 as a selective growth mask, an about 1 μm-thickness InP buried layer 20 is grown by MOVPE on the InP substrate 10 on both sides of the active layer mesa stripe 18. FIG. 7C is a sectional view along the line B–B' in FIG. 8B. At this time, TMI and $PH_3$ are used respectively as a III group element material and a V group element material. DEZn is used as a dopant gas to add Zn to the p type InP buried layer 20, and a p doping concentration is about $1 \times 10^{18}$ cm$^{-3}$. A temperature and a pressure for the growth are about 630° C. and about 0.1 atmospheric pressure.

Following the formation of the p type InP buried layer 20, an about 0.7 μm thickness n type InP buried layer 22 is grown (FIGS. 7C and 8B). At this time, $H_2Se$ is used as a dopant gas to add Se to the n type InP buried layer 22, and an n doping concentration is about $1 \times 10^{18}$ cm$^{-3}$.

As in the first embodiment, Se is added in growing the n type InP buried layer 22, whereby the over growth of the n type InP buried layer 22 never take place either at the branching part 34.

Figure 7D:
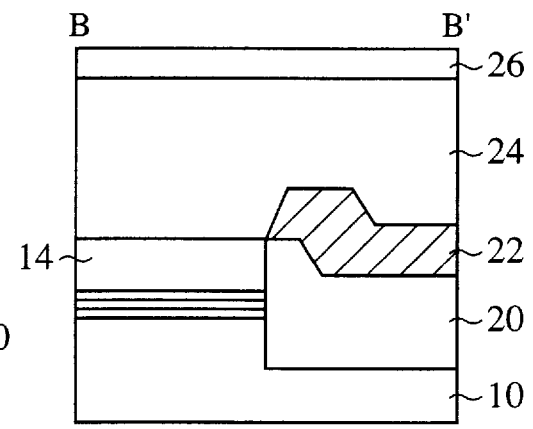

Then, the $SiO_2$ film 16 is removed by ethcing using HF, and as shown in FIGS. 7D and 8C, a p type InP clad layer 24 and a p type InGaAs contact layer 26 are sequentially formed on the entire surface. FIG. 7D is a sectional view along the line B–B' in FIG. 8C.

Figure 7E:
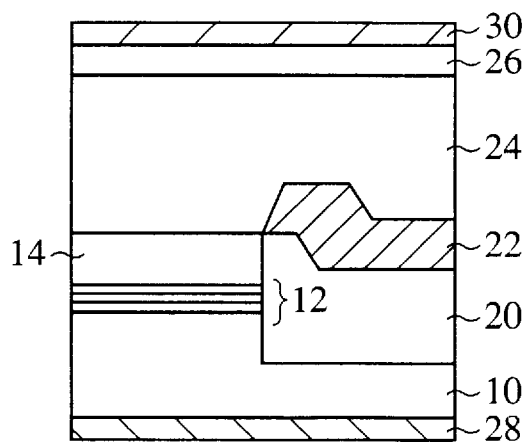

Finally, as shown in FIG. 7E, an n type electrode 28 is formed on the underside of the n type InP substrate 10, and a p type electrode 30 is formed on the p type InGaAs contact layer 26. Thus, the fabrication of the optical integrated circuit can be completed.

As described above, according to the present embodiment, in forming the n type InP buried layer, Se is added as an n type dopant, whereby the n type InP buried layer can be formed without the over growth on the selective growth mask.

Modifications

The present invention is not limited to the above-described embodiments and can cover other various modifications.

Figure 9:
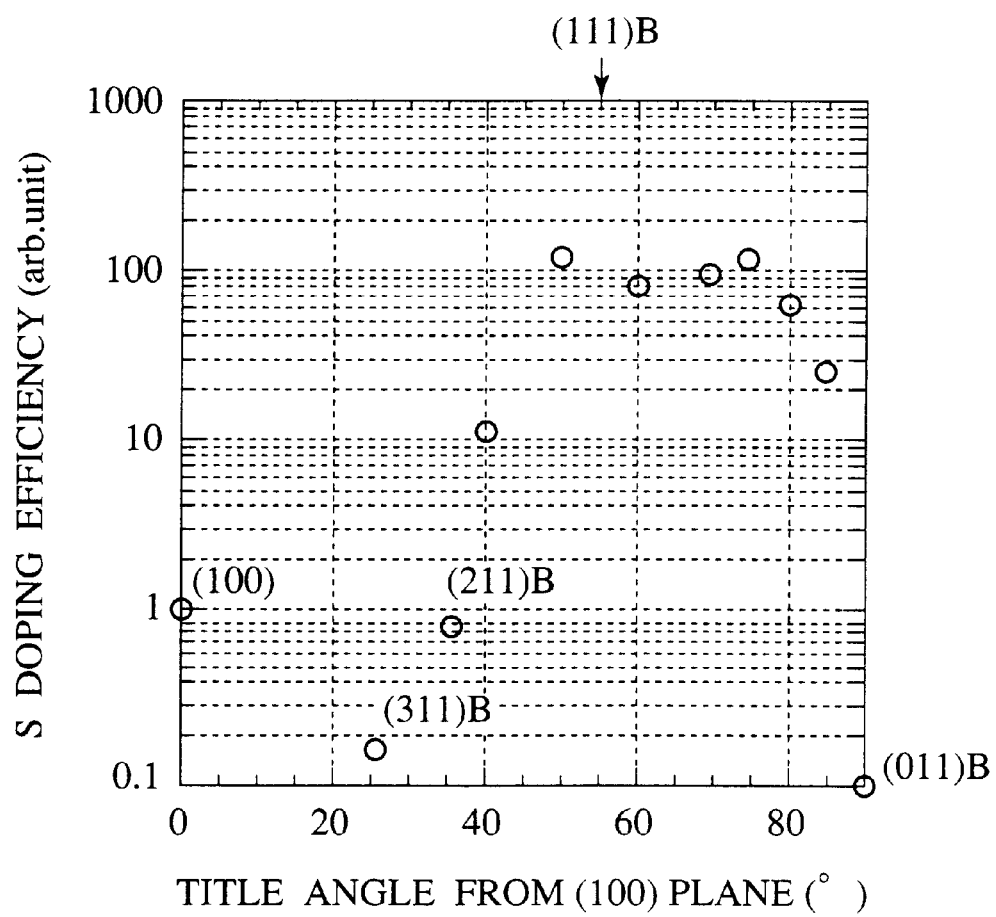
FIG. 9 is a graph of substrate orientation dependence of S doping efficiency.
Figure 10A:
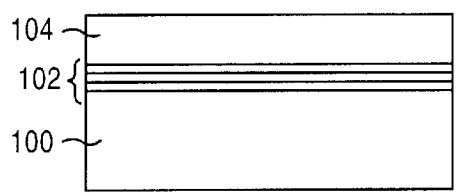
FIGS. 10A–10E are sectional views of the semiconductor laser having the BH structure in the steps of the method for fabricating the same, which show the method.
Figure 10B:
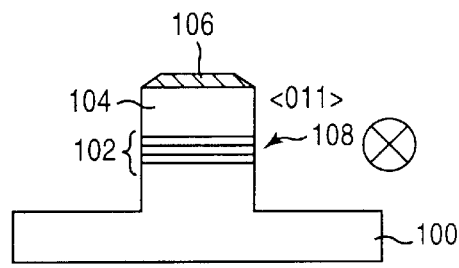
Figure 10C:
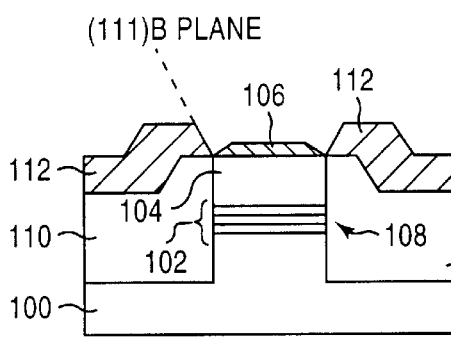
Figure 10D:
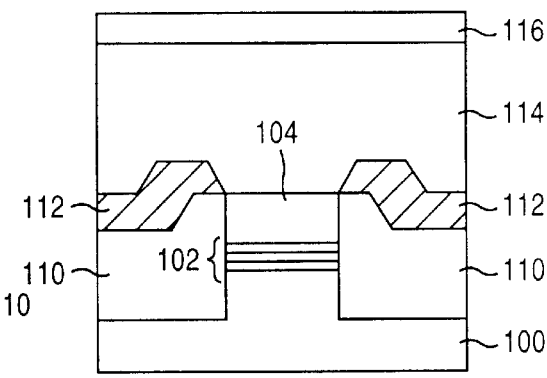
Figure 10E:
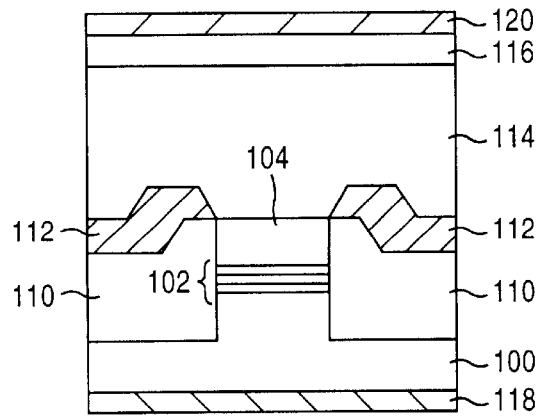
Figure 11:
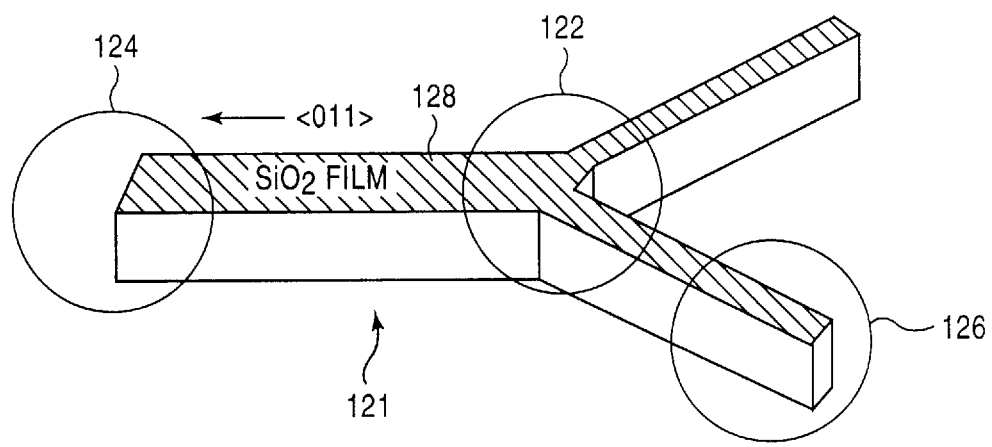
Figure 12A:
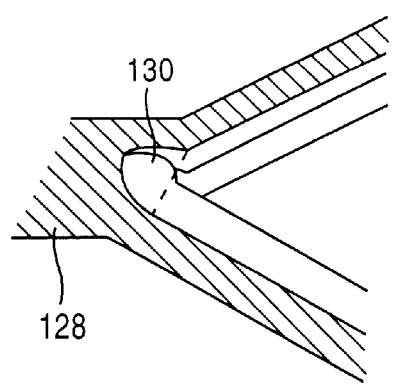
FIGS. 12A–12C are diagrammatic views of the over growth of the buried layer on the selective growth mask.
Figure 12B:
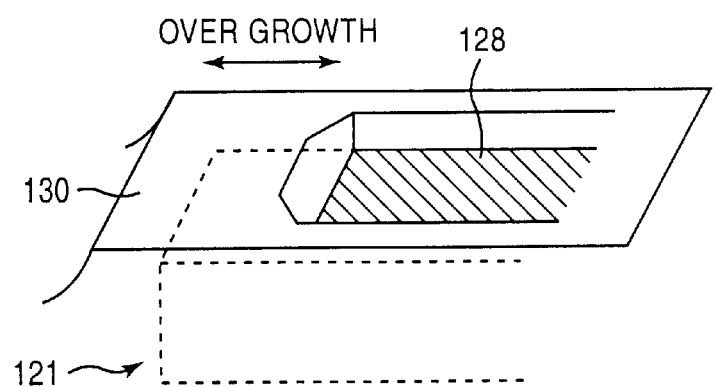
Figure 12C:
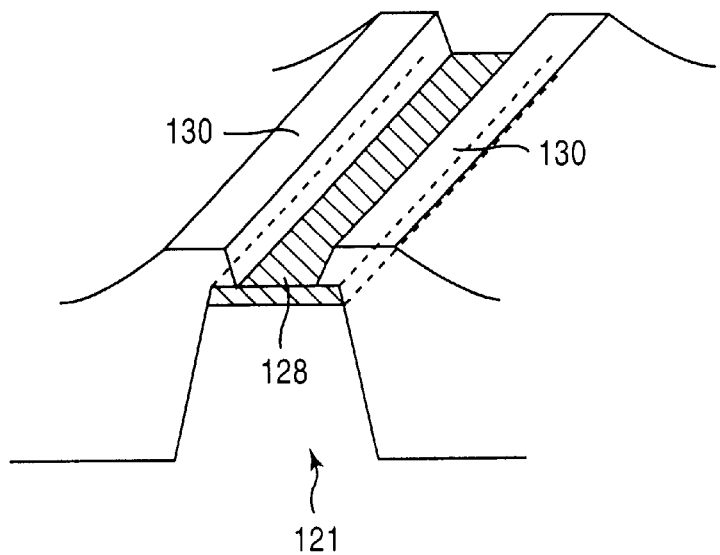
Figure 13:
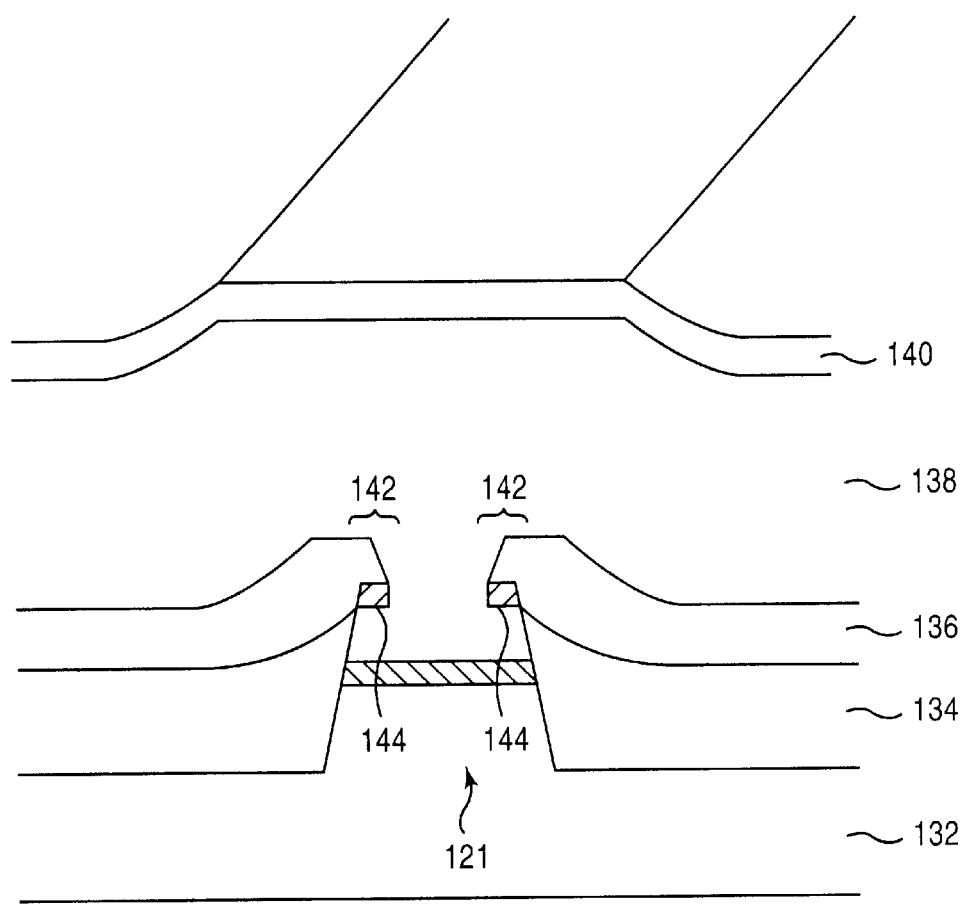
FIG. 13 is a diagrammatic sectional view of the optical integrated circuit having voids formed by the over growth of the buried layer.

For example, in the above-described embodiments, in forming the n type InP buried layer 22, $H_2Se$ is used as an n type dopant to add Se. However, an element to be added to the n type InP buried layer 22 is not limited to Se. The VI element besides Se can be incorporated in P lattice points to be donors, as can be Se. For example, as shown in FIG. 9, substrate orientation dependent of the doping efficiency of S is increased by more than 2 figures near (111)B plane than in (100) plane. Accordingly, $H_2S$ is used as an n type dopant for growing the n-InP buried layer to add S, whereby, as in the above-described embodiments, the over growth of the n type InP buried layer at the branching part and the terminal part of the active layer mesa stripe can be suppressed.

At the time of growing the n type and the p type InP buried layer by MOVPE in the above-described embodiments, a gas containing chloride, such as $Cl_2$, HCl, $CH_3Cl$, $CCl_4$, $CH_3CH_2Cl$, $PCl_3$ or others, may be added.

In the above-described embodiments, in forming the p type InP buried layer 20, DEZn is used as a dopant gas to add Zn, but the dopant gas is not limited to DEZn. For example, $Cp_2Fe$ may. be used as a dopant to add Fe.

In the above-described embodiments, the $SiO_2$ film 16 is formed as an etching mask for forming the active layer mesa stripe 18, but the etching mask is not limited to $SiO_2$ film. In place of $SiO_2$ film, $Si_3N_4$ film, SiON film or others may be used.

In the above-described embodiments, InP is used as a material of the buried layer, but the material of the buried layer is not limited to InP. III–V group semiconductors besides InP may be used as a material of the buried layer.

In the above-described embodiments, the InGaAsP/InGaAsP multi-quantum well layer 12 is used as the active layer, but the structure of the active layer is not limited to the quantum well structure.

As described above, according to the present invention, a buried layer of a III–V group semiconductor with Se or S added in an above $1 \times 10^{18}$ cm$^{-3}$ concentration is formed on a projected structure including a surface with a mask formed on at a peripheral part of the projected structure without the mask formed on, whereby the buried layer can be grown without the over growth.

What is claimed is:

1. A method for fabricating semiconductor device comprising the step of forming a buried layer of III–IV Group semiconductor with Se or S added in an above $5 \times 10^{18}$ cm$^{-3}$ concentration against a projected structure including a surface with a mask formed on, at a peripheldral part of the projected structure without the mask formed on, wherein a surface of the buried layer is higher than that of the projected structure at least near a edge of the mask.

2. A method for fabricating a semiconductor device according to claim 1, wherein
the III–V group semiconductor is InP.

3. A method for fabricating a semiconductor device according to claim 1, wherein
the projected structure is a mesa stripe having a branching part.

4. A method for fabricating a semiconductor device according to claim 2, wherein
the projected structure is a mesa stripe having a branching part.

5. A method for fabricating a semiconductor device according to claim 1, wherein
the projected structure is a mesa stripe having a terminal part.

6. A method for fabricating a semiconductor device according to claim 2, wherein
the projected structure is a mesa stripe having a terminal part.

7. A method for fabricating a semiconductor device according to claim 3, wherein
the projected structure is a mesa stripe having a terminal part.

8. A method for fabricating a semiconductor device according to claim 4, wherein
the projected structure is a mesa stripe having a terminal part.

9. A method for fabricating a semiconductor device according to claim 1, wherein the projected structure is a mesa stripe having a <011>direction part and a part of a direction other than <011>direction.

10. A method for fabricating a semiconductor device according to claim 2, wherein the projected structure is a mesa stripe having a <011>direction part and a part of a direction other than <011>direction.

11. A method for fabricating a semiconductor device according to claim 3, wherein the projected structure is a mesa stripe having a <011>direction part and a part of a direction other than <011>direction.

12. A method for fabricating a semiconductor device according to claim 4, wherein the projected structure is a mesa stripe having a <011>direction part and a part of a direction other than <011>direction.

13. A method for fabricating a semiconductor device according to claim 1, wherein a gas containing chlorine is introduced when the buried layer is formed.

14. A method for fabricating a semiconductor device according to claim 2, wherein a gas containing chlorine is introduced when the buried layer is formed.

15. A method for fabricating a semiconductor device according to claim 3, wherein a gas containing chlorine is introduced when the buried layer is formed.

16. A method for fabricating a semiconductor device according to claim 4, wherein a gas containing chlorine is introduced when the buried layer is formed.

17. A method for fabricating a semiconductor device according to claim 1, wherein the mask is a film of silicon oxide and/or silicon nitride.

18. A method for fabricating a semiconductor device according to claim 2, wherein the mask is a film of silicon oxide and/or silicon nitride.

19. A method for fabricating a semiconductor device according to claim 3, wherein the mask is a film of silicon oxide and/or silicon nitride.

20. A method for fabricating a semiconductor device according to claim 4, wherein the mask is a film of silicon oxide and/or silicon nitride.

* * * * *